United States Patent
Song et al.

(10) Patent No.: US 10,819,368 B2
(45) Date of Patent: Oct. 27, 2020

(54) METHOD FOR COMPRESSING AND RESTORING TIME SERIES DATA

(71) Applicants: SAMSUNG ELECTRONICS CO., LTD., Suwon-Si, Gyeonggi-Do (KR); Seoul National University R&DB Foundation, Seoul (KR)

(72) Inventors: Myung Geun Song, Seoul (KR); Myung Joo Kang, Seoul (KR); Byeong Eon Lee, Yongin-si (KR); Myoung Su Cho, Suwon-si (KR); Young Jin Koh, Seoul (KR); Geon Woo Kim, Seoul (KR); Sang Yeon Kim, Seoul (KR); Hyun Seo, Seoul (KR); Dong Jun Woo, Seoul (KR); Jae Woong Choi, Seoul (KR)

(73) Assignees: SAMSUNG ELECTRONICS CO., LTD., Suwon-si, Gyeonggi-Do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/547,770

(22) Filed: Aug. 22, 2019

(65) Prior Publication Data

US 2020/0220555 A1      Jul. 9, 2020

(30) Foreign Application Priority Data

Jan. 9, 2019   (KR) ........................ 10-2019-0002884

(51) Int. Cl.
*H03M 7/30* (2006.01)
*H03M 7/00* (2006.01)
(Continued)

(52) U.S. Cl.
CPC ............ *H03M 7/3059* (2013.01); *H03M 5/00* (2013.01); *H03M 7/00* (2013.01); *H03M 7/30* (2013.01); *H03M 7/42* (2013.01)

(58) Field of Classification Search
CPC ............ H03M 7/30; H03M 5/00; H03M 7/00; H03M 7/42
(Continued)

(56) References Cited

U.S. PATENT DOCUMENTS 8,010,704 B2   8/2011   Stengelin
8,271,566 B2   9/2012   Droz et al.
(Continued)

FOREIGN PATENT DOCUMENTS

JP   2653558    9/1997
JP   4655608    3/2011
(Continued)

*Primary Examiner* — Joseph J Lauture
(74) *Attorney, Agent, or Firm* — F. Chau & Associates, LLC

(57) ABSTRACT

A method for compressing time series data includes: reading original data including time series data; measuring a unit of the original data; determining a threshold for determining a range allowing for a difference between compressed data and the original data; performing longest distance downsampling to preserve an abnormal point of the original data; storing a start point and an end point of the original data; performing drop-out on the longest distance downsampling result, wherein the drop-out is not performed for the start point and the end point; and if the number of values of the original data is smaller than α times the original data length, storing at least one of the values of the original data as a reference point, wherein α is a real number having a value between 0 and 1.

15 Claims, 13 Drawing Sheets

(51) Int. Cl.
*H03M 7/42* (2006.01)
*H03M 5/00* (2006.01)

(58) Field of Classification Search
USPC .............. 341/87, 50, 51, 106, 107; 709/247; 708/203
See application file for complete search history.

(56) References Cited

U.S. PATENT DOCUMENTS

| | | |
|---|---|---|
| 9,325,345 B2 | 4/2016 | Ogasawara et al. |
| 2018/0247239 A1* | 8/2018 | Horrell ................. G06F 11/004 |

FOREIGN PATENT DOCUMENTS

| | | |
|---|---|---|
| JP | 4688690 | 5/2011 |
| JP | 2012-244235 | 12/2012 |
| JP | 2014-021162 | 2/2014 |
| KR | 10-1575015 | 1/2015 |
| KR | 10-2018-0112886 | 10/2018 |

* cited by examiner

| Input | Original Data |
|---|---|
| 01 | Calculate the difference between adjacent values in Original Data and call it Dx. |
| 02 | Calculate the difference between adjacent values in Dx and call it DDx. |
| 03 | Rounding DDx value and find minimum, and call it unit. |
| 04 | If all value in Dx is divided by unit, set divided True. If not, set divided False. |
| Output | unit, divided |

| Input | Original Data |
|---|---|
| 01 | Calculate the difference between adjacent values in Original Data and call it Dx. |
| 02 | Set Dx as Clustered Data. |
| 03 | Using K-means clustering, divide the Clustered Data into 2 clusters. |
| 04 | Iterate until larger cluster is less than 85% of the Clustered Data: |
| 05 |     Set bigger cluster as Clustered Data. |
| 06 |     Using K-means clustering, divide the Clustered Data into 2 clusters. |
| 07 | Set Threshold as the 98 percentile of the clustered data set. |
| Output | Threshold |

| Input | Original Data, window size |
|---|---|
| 01 | All points have distance value 0, and previous value null. |
| 02 | Divide the Original Data with intervals of size of window size. |
| 03 | Iterate for all intervals: |
| 04 |     Iterate all point P in interval: |
| 05 |         If first interval |
| 06 |             Set distance of P as the distance P-first point. |
| 07 |             Set previous of P as first point. |
| 08 |         else |
| 09 |             Iterate all point Q in previous interval: |
| 10 |                 If (distance of Q + distance P-Q) is larger than distance of P |
| 11 |                   Set distance of P as (distance of Q + distance P-Q). |
| 12 |               Set previous of P as Q. |
| 13 | Set Route as the empty list. |
| 14 | Choose last point O of Original Data. |
| 15 | Iterate until O is the first point of Original Data: |
| 16 |     Add O to the leftmost of Route. |
| 17 |     Set O as previous of O. |
| Output | Route |

| Input | Original Data, Threshold |
|---|---|
| 01 | Set initial window size as smallest 2n, which is bigger than 10% of the Original Data length. |
| 02 | Perform Longest Distance downsampling(LD) with initial window size and reconstruct from the result. |
| 03 | Iterate until error between reconstructed data and Original Data is less |
| 04 | than Threshold: |
| 05 | Cut the window size in half. |
| 06 | For the interval with error larger than Threshold, perform LD again with new windows size. |
| 07 | Concatenate the new result to older result. |
| Output | Route |

| Input | Original, Compressed Result, Threshold, Fixed |
|---|---|
| 01 | Make Original Reconstructing by reconstructing data from Compressed Result. |
| 02 | Iterate all point P in Compressed Result: |
| 03 |     If P is in Fixed |
| 04 |         Go to next iteration. |
| 05 |     Make Deleted List by deleting P in Compressed Result. |
| 06 |     Make Deleted Reconstructing by reconstructing from Deleted List. |
| 07 |     If maximum difference between Deleted Reconstructing and Original is less than Threshold |
| 08 |         Add P to the Dropping Candidate. |
| 09 |         Calculate the increased error Deleted Reconstructing. |
| 10 | Iterate until Dropping Candidate gets empty: |
| 11 |     Find the point P with smallest increased error. |
| 12 |     Delete P in Compressed Result and Dropping Candidate. |
| 13 |     Update the maximum error and increased error of neighborhood points of P. |
| 14 |     If new maximum error is larger than threshold |
| 15 |         Delete that point in Dropping Candidate. |
| Output | Compressed Result |

| Input | Compressed Result, unit, standard deviation of each interval, flag of add noise |
|---|---|
| 01<br>02<br>03<br><br>04<br>05<br>06<br><br>07<br>08 | Do linear interpolation of compressed data.<br>If flag of add noise == True<br>   Do noise addition algorithm to linear interpolated data using standard deviation of each interval.<br>If unit == -1<br>   Get the unique elements of the array of compressed data.<br>   Fit interpolated data to nearest unique elements of the array of compressed data.<br>If unit >= 0<br>   Fit interpolated data by using unit. |
| Output | Recovered data |

| Input | linear interpolated data of the compressed data, standard deviation of each interval |
|---|---|
| 01<br>02<br>03<br>04<br><br>05<br>06<br>07<br><br>08<br>09 | Generate a random array from the Gaussian distribution for each step by using standard deviation of each step.<br>For each index of downsampled data index:<br>    If value of index < value of next index<br>        Sort interval in a random array between given index and given next index by descending order.<br>        Shuffle front half and back half of sorted interval separately.<br>    If value of index > value of next index<br>        Sort interval in a random array between given index and given next index by ascending order.<br>        Shuffle front half and back half of sorted interval separately.<br>    m a shuffled array and linear interpolated data. |
| Output | noise added data |

METHOD FOR COMPRESSING AND RESTORING TIME SERIES DATA

CROSS-REFERENCE TO RELATED APPLICATION

This application claims priority under 35 U.S.C. § 119 to Korean Patent Application No. 10-2019-0002884 filed on Jan. 9, 2019 in the Korean Intellectual Property Office, the disclosure of which is incorporated by reference herein in its entirety.

TECHNICAL FIELD

The present inventive concept relates to a method for compressing and restoring time series data, and more particularly, to a method for compressing the time series data by performing Longest Distance downsampling with Flexible Interval and restoring the time series data using a unit of original data.

DISCUSSION OF THE RELATED ART

Various sensing data may be generated during a semiconductor fabrication process. The sensor data is generally in the form of time series data containing values arranged chronologically. The amount of time series data generated in the semiconductor fabrication process is very large, which may make it difficult to store the data in a general storage device.

Therefore, techniques for compressing and restoring the time series data are currently under development. However, when compressing and restoring time series data using lossy compression in the same domain, the compression ratio of the compressed data and the quality of the restored data should be increased.

SUMMARY

According to an exemplary embodiment of the present inventive concept, a method for compressing time series data includes: reading original data including time series data; measuring a unit of the original data; determining a threshold for determining a range allowing for a difference between compressed data and the original data; performing longest distance downsampling to preserve an abnormal point of the original data; storing a start point and an end point of the original data; performing drop-out on the longest distance downsampling result, wherein the drop-out is not performed for the start point and the end point; and if the number of values of the original data is smaller than $\alpha$ times the original data length, storing at least one of the values of the original data as a reference point, wherein $\alpha$ is a real number having a value between 0 and 1.

According to an exemplary embodiment of the present inventive concept, a method for restoring time series data includes: reading a compression result of time series data; performing linear interpolation on the compression result; determining whether a unit for original data has been measured; when it is determined that the unit for the original data has been measured, restoring the linearly interpolated compression result by using the unit; and when it is determined that the unit for the original data has not been measured, restoring the linearly interpolated compression result by using values of the original data.

According to an exemplary embodiment of the present inventive concept, a computing device includes: a time series data compressing module configured to: read original data including time series data, measure a unit of the original data, determine a threshold for determining a range allowing for a difference between compressed data and the original data, perform longest distance downsampling to preserve an abnormal point of the original data, store a start point and an end point of the original data, perform drop-out on the longest distance downsampling result, wherein the drop-out is not performed for the start point and the end point, and when the number of values of the original data is smaller than $\alpha$ times the original data length, store at least one of the values of the original data as a reference point, wherein $\alpha$ is a real number having a value between 0 and 1; and a time series data restoring module configured to: read a compression result of the time series data, perform linear interpolation on the compression result, determine whether the unit for original data has been measured, when it is determined that the unit for the original data has been measured, restore the linearly interpolated compression result by using the unit, and when it is determined that the unit for the original data has not been measured, restore the linearly interpolated compression result by using values of the original data.

According to an exemplary embodiment of the present inventive concept, a computer-readable recording medium storing a program including one or more instructions to perform a method including: reading original data including time series data; measuring a unit of the original data; determining a threshold for determining a range allowing for a difference between compressed data and the original data; performing longest distance downsampling to preserve an abnormal point of the original data; storing a start point and an end point of the original data; performing drop-out on the longest distance downsampling result, wherein the drop-out is not performed for the start point and the end point; and if the number of values of the original data is smaller than $\alpha$ times the original data length, storing at least one of the values of the original data as a reference point, wherein $\alpha$ is a real number having a value between 0 and 1.

According to an exemplary embodiment of the present inventive concept, a computer-readable recording medium storing a program including one or more instructions to perform a method including: reading a compression result of time series data; performing linear interpolation on the compression result; determining whether a unit for original data has been measured; when it is determined that the unit for the original data has been measured, restoring the linearly interpolated compression result by using the unit; and when it is determined that the unit for the original data has not been measured, restoring the linearly interpolated compression result by using values of the original data.

BRIEF DESCRIPTION OF THE DRAWINGS

The above and other features of the present inventive concept will become more apparent by describing in detail exemplary embodiments thereof, with reference to the accompanying drawings, in which:

FIGS. 3, 4, 5, 6 and 7 are diagrams illustrating a time series data compressing method according to an exemplary embodiment of the present inventive concept;

FIGS. 9, 10, 11, 12 and 13 are diagrams illustrating a time series data restoring method according to an exemplary embodiment of the present inventive concept.

DETAILED DESCRIPTION OF THE EMBODIMENTS

Hereinafter, exemplary embodiments of the present inventive concept will be described more fully hereinafter with reference to the accompanying drawings.

Figure 1:
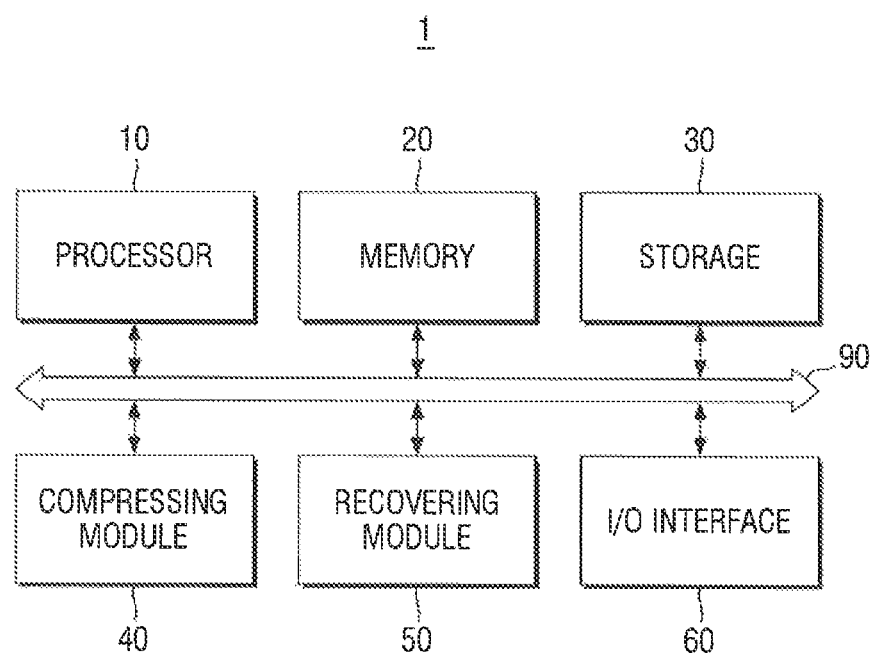
FIG. 1 is a diagram illustrating a computing device according to an exemplary embodiment of the present inventive concept.

FIG. 1 is a diagram illustrating a computing device according to an exemplary embodiment of the present inventive concept.

Referring to FIG. 1, a computing device 1 according to an exemplary embodiment of the present inventive concept includes a processor 10, a memory 20, a storage 30, a compressing module 40, a restoring module 50 and an I/O interface 60. The processor 10, the memory 20, the storage 30, the compressing module 40, the restoring module 50 and the I/O interface 60 may exchange data with each other through a bus 90.

The compressing module 40 performs compression on time series data, which will be described later in detail with reference to FIGS. 2 to 7. The restoring module 50 performs restoration on time series data, which will be described later with reference to FIGS. 8 to 13. For example, the compressing module 40 and the restoring module 50 perform time series data compression and restoration methods according to an exemplary embodiment of the present inventive concept.

The compressing module 40 and the restoring module 50 may be implemented in software. For example, the compression and restoration functions performed by the compressing module 40 and the restoring module 50 may be implemented as a program or an application that includes one or more instructions. Such a program or application may be stored in a computer-readable recording medium.

According to an exemplary embodiment of the present inventive concept, the compressing module 40 and the restoring module 50 may be implemented in hardware. For example, the compression and restoration functions respectively performed by the compressing module 40 and the restoring module 50 may be implemented in hardware, such as a semiconductor circuit, including various semiconductor devices designed to perform the functions.

According to an exemplary embodiment of the present inventive concept, a portion of the compressing module 40 and the restoring module 50 may be implemented in software, and another portion thereof may be implemented in hardware.

The processor 10 may control the computing device 1. For example, the processor 10 may execute an application or a program corresponding to the compressing module 40 and the restoring module 50 implemented in software. In the present embodiment, the processor 10 may include a Central Processing Unit (CPU), but the scope of the present inventive concept is not limited thereto.

The memory 20 provides a storage space for execution or operation of the compressing module 40 and the restoring module 50 implemented in software or hardware. For example, the memory 20 may load an application or a program corresponding to the compressing module 40 and the restoring module 50 so that the processor 10 can execute the application or the program, or the memory 20 may provide an environment for storing data used during the execution of the application or program corresponding to the compressing module 40 and the restoring module 50 or during the operation of the compressing module 40 and the restoring module 50 implemented in the form of hardware. In the present embodiment, the memory 20 may include a dynamic random-access memory (DRAM), but the scope of the present inventive concept is not limited thereto.

The storage 30 provides a storage space for execution or operation of the compressing module 40 and the restoring module 50 implemented in software or hardware. For example, the storage 30 may provide a storage space that allows data to be stored during the execution or operation of the compressing module 40 and the restoring module 50 to be maintained even when the computing device 1 is turned off. In the present embodiment, the storage 30 may include a solid state drive (SSD), a hard disk drive (HDD) or the like, but the scope of the present inventive concept is not limited thereto.

The I/O interface 60 provides a connection interface with other external devices. For example, the execution or operation process of the compressing module 40 and the restoring module 50, or the result thereof may be communicated to other devices (e.g., a display device) connected via the I/O interface 60 and, for example, displayed visually to a user.

The configuration of the computing device 1 is merely an example, and the scope of the present inventive concept is not limited thereto. For example, the computing device 1 may further include additional components such as a network interface that provides data exchange with other devices connected to the network, and may omit some of the components shown in FIG. 1.

A time series data compressing method performed by the compressing module 40 will be described with reference to FIGS. 2 to 7.

Figure 2:
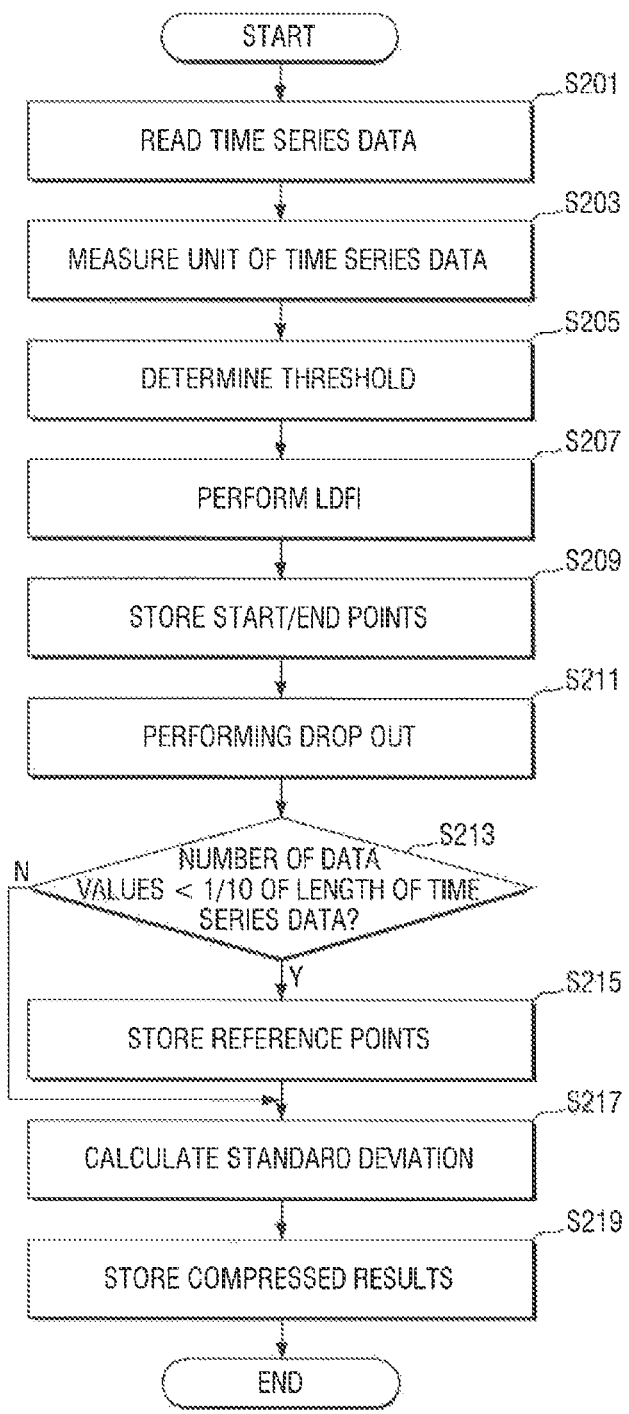
FIG. 2 is a flowchart illustrating a time series data compressing method according to an exemplary embodiment of the present inventive concept.

FIG. 2 is a flowchart illustrating a time series data compressing method according to an exemplary embodiment of the present inventive concept. FIGS. 3, 4, 5, 6 and 7 are diagrams illustrating a time series data compressing method according to an exemplary embodiment of the present inventive concept.

Referring to FIG. 2, a time series data compressing method according to an exemplary embodiment of the present inventive concept includes reading original data including time series data (S201).

Here, time series data refers to data having a plurality of values arranged chronologically. For example, sensing data measured with a temperature sensor may have a plurality of temperature values arranged over time. The time series data can be expressed as a two-dimensional graph in which the x axis represents time and the y axis represents data values.

The time series data may be obtained from various sensors used during a semiconductor fabrication process. Further, the time series data may be stored in the storage 30 as described with reference to FIG. 1, and then used for defect detection of a semiconductor fabrication process or for analysis depending on various other purposes. For example, the time series data may be used for analyzing a manufactured semiconductor device.

However, since the time series data is generated continuously over time, the amount of the time series data may be large. Therefore, it is desirable to compress and store the time series data instead of storing it without compressing the time series data. To this end, the compressing module 40 first reads, for example, the time series data stored in the memory 20 or the storage 30 as described with reference to FIG. 1.

Next, the method includes measuring a unit (e.g., according to a scale of measurement) of original data (S203).

The unit of measurement of the sensing data may be different depending on the sensor. For example, some sensors may generate sensing data in integer units, while other sensors may generate sensing data in decimal units. However, the sensing data may be measured with a specific scale of measurement, and the values may be discrete.

In the case of sensing data having discrete values, restoration data being almost equal to that of original data can be obtained by using a unit of the original data in a process of restoring the compressed data, if the unit can be recognized. For example, a quality of the restoration data that may be substantially equal to that of the original data may be obtained by using the unit the restoring process of the compressed data. Therefore, the compressing module 40 measures the unit of the original data, and then stores the measured unit in the storage 30, for example.

FIG. 3 is a diagram showing an implementation of measuring a unit for original data in pseudo code, according to an exemplary embodiment of the present inventive concept. Referring to FIG. 3, the unit of the original data may be measured through the following process.

First, a difference between values of adjacent data in Original Data is measured as a first difference value Dx.

Then, a difference between adjacent first difference values Dx is measured as a second difference value DDx.

Thereafter, a minimum value of the second difference value DDx is determined by the unit of the original data. If the minimum value is 0, the minimum value of the second difference value DDx excluding 0 is determined by the unit.

For example, when the original data includes "1, 2, 3, 4, 3, 3, 4, 4, 2," the first difference value Dx therefore may be "1, 1, 1, 1, 0, 1, 0, 2," and the second difference value DDx therefore may be "0, 0, 0, 1, 1, 1, 2." In this case, the minimum value '1' excluding 0 may be determined by the unit of the original data.

If the first difference value Dx can be divided by the unit, the variable "divided" is set to True, otherwise the variable "divided" is set to False.

Referring again to FIG. 2, the time series data compressing method according to an exemplary embodiment of the present inventive concept includes determining a threshold for determining a tolerance between compressed data and original data using a clustering technique (S205).

Since the time series data compressing method according to an exemplary embodiment of the present inventive concept uses a lossy algorithm, a difference between the compressed data and the original data value may occur. However, if a range allowing the difference between the compressed data and the original data is too wide, a loss of information or data may occur. In addition, if the range allowing the difference between the compressed data and the original data is too narrow, the compression ratio may be lowered. Therefore, to increase the performance of the compression algorithm, the compressing module 40 determines a threshold for determining the tolerance between the compressed data and the original data using the clustering technique. For example, a tolerance between the compressed data and the original data may refer to a point at which the difference between the compressed data and the original data will not result in a loss of information or a decreased compression ratio.

FIG. 4 is a diagram showing, in pseudo code, an implementation of determining a threshold for determining a tolerance between compressed data and original data using a clustering technique. Referring to FIG. 4, the determination of the threshold may be performed through the following process.

First, a difference between values of adjacent data in Original Data is measured as a first difference value Dx. Then, the first difference value Dx is set as Clustered Data.

Then, the first difference value Dx is divided into two clusters using K-means clustering.

Then, a first cluster which is larger between the two divided clusters is set as Clustered Data, and K-means clustering is repeatedly performed to divide the first cluster (the Clustered data) into two clusters. This process is repeatedly performed until a second cluster which is larger between the two divided clusters reaches less than 85% of the Clustered Data (e.g., the first cluster set as the Clustered data).

Then, when the second cluster which is larger between the two divided clusters reaches less than 85% of the Clustered Data, a value corresponding to 98% of a data set (e.g., a clustered data set) included in the second cluster is determined as a threshold.

Referring again to FIG. 2, the time series data compressing method according to an exemplary embodiment of the present inventive concept includes performing downsampling of the longest distance to preserve (e.g., save) an abnormal point in the original data (S207).

For example, it may be useful to analyze an abnormal point in sensor data detected through a sensor in a semiconductor fabrication process. The abnormal point may be data corresponding to a case where the sensor data detected through the sensor is out of an operating range of a normal operation. In this case, analyzing the abnormal point may be a clue to identify the cause of defects in the semiconductor fabrication process.

However, in most cases, the abnormal point corresponds to a maximum value or minimum value rather than an intermediate value in a predetermined interval of the time series data. Therefore, to prevent the compression result from omitting the abnormal point, e.g., to preserve the abnormal point even in the compression result, the compressing module 40 performs the longest distance downsampling.

In the present embodiment, performing the longest distance downsampling may include setting one or more intervals for performing the longest distance downsampling, and sampling one data in each of the one or more intervals such that a total distance when connecting the data sampled in each of the one or more intervals is the longest distance. FIG. 5 is a diagram illustrating an implementation of performing the longest distance downsampling using a dynamic programming technique in pseudo code according to an exemplary embodiment of the present inventive concept.

In addition, the longest distance downsampling described above is a case where a window size used for setting one or more intervals has a single size. The fact that the window size has a single size means that all of one or more intervals for performing the longest distance downsampling have substantially the same size.

However, actual sensor data may have a different amount of information for each interval. For example, the amount of information may be relatively large in the first interval, and the amount of information may be relatively small in the second interval. In this case, it is possible to increase the compression quality by sampling at a different rate for each interval rather than sampling each interval at the same rate.

To this end, the compressing module 40 performs Longest Distance downsampling with Flexible Interval (LDFI). The LDFI refers to performing the longest distance downsampling by setting the window size used for setting at least one interval for performing the longest distance downsampling to a length. For example, the length may vary.

FIG. 6 is a diagram illustrating an implementation of performing the LDFI in pseudo code according to an exemplary embodiment of the present inventive concept.

Referring to FIG. 6, performing the longest distance downsampling includes, when a difference between a downsampling result, which is obtained by performing the longest distance downsampling with a first window size, and the original data exceeds a threshold, dividing the first window size into a second window size corresponding to the half of the first window size and performing the longest distance downsampling with the second window size. This process is repeatedly performed until the difference between the downsampling result and the original data is less than the threshold.

Referring again to FIG. 2, the time series data compressing method according to an exemplary embodiment of the present inventive concept includes storing start and end points of original data (S209).

In some of the time series data sensed in the semiconductor process, the start and end points of the original data may be used in the semiconductor fabrication process. Thus, the compressing module 40 stores the start point and the end point of the original data in the storage 30, for example.

Further, the time series data compressing method according to an exemplary embodiment of the present inventive concept includes performing a drop-out on the result of the longest distance downsampling except for the start point and the end point of the original data (S211).

Drop-out refers to further increasing the compression ratio by removing unnecessary data from the result obtained by performing the longest distance downsampling. However, the drop-out is not performed at the start point and the end point which may be used in the semiconductor process.

FIG. 7 is a diagram illustrating an implementation of performing drop-out in pseudo code according to an exemplary embodiment of the present inventive concept.

Referring to FIG. 7, performing a drop-out includes determining a candidate to be deleted from the result obtained by performing the longest distance downsampling, comparing a value of the candidate with a value of the original data corresponding thereto, and if a difference between the value of the candidate and the value of the original data exceeds the threshold, deleting the candidate from the result of the longest distance downsampling.

Referring again to FIG. 2, the time series data compressing method according to an exemplary embodiment of the present inventive concept includes, if the number of values of the original data is smaller than $\alpha$ times the original data length (where a is a real number having a value between 0 and 1), storing at least some of the values of the original data as reference points (S213, S215). For example, if the number of values of the time series data is smaller than $1/10^{th}$ times the length of the time series data, then some values of the time series data will be stored as reference points. For example, if the number of values of the time series data is not smaller than $1/10^{th}$ times the length of the time series data, then some values of the time series data will not be stored as reference points and a standard deviation will be calculated, which is described in more detail below.

Here, the value of a may be selected according to the actual implementation purpose, but the value of a may be set to 0.1, for example. For example, when the number of values of the original data is smaller than $1/10$ of the original data length, it is determined that the number of kinds of the original data itself is small, and at least some of the values of the original data are stored as reference points to be used in a restoration process. In this case, the unit value may be set to −1.

Further, the time series data compressing method according to an exemplary embodiment of the present inventive concept includes calculating a standard deviation (S217).

The compressing module 40 may calculate the standard deviation from the resultant data obtained so far and store the value in the storage 30, for example. The standard deviation may be used to add noise in a restoration process which will be described below.

Further, the time series data compressing method according to an exemplary embodiment of the present inventive concept includes storing the compression result (S219).

The compressing module 40 may store the compression result obtained so far, for example, in the storage 30.

The time series data compressing method according to an exemplary embodiment of the present inventive concept may increase the compression ratio and increase the compression quality by determining the threshold using the clustering technique and performing LDFI and drop-out based on the threshold.

Hereinafter, a time series data restoring method performed by the restoring module 50 will be described with reference to FIGS. 8 to 13.

Figure 8:
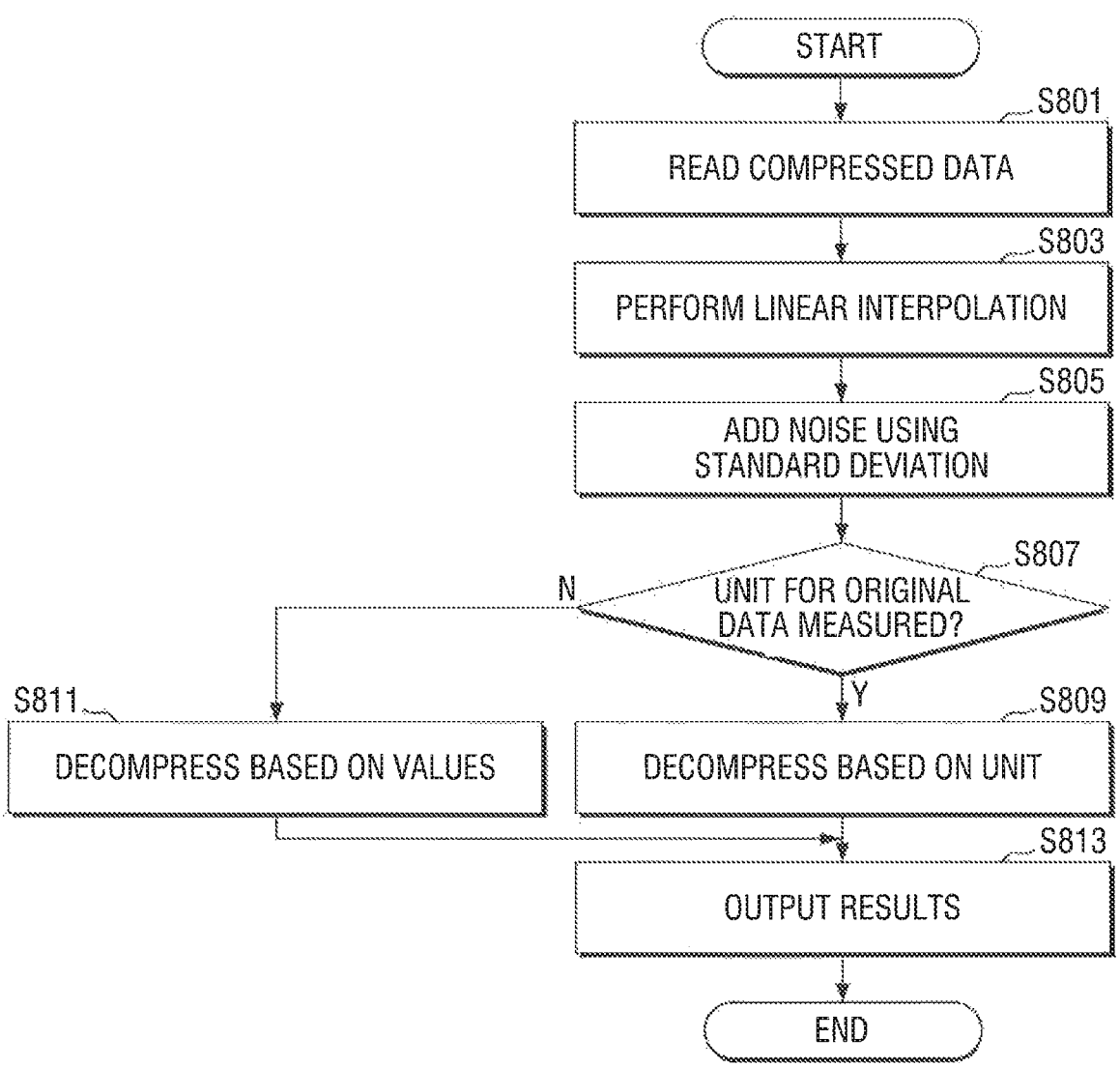
FIG. 8 is a flowchart illustrating a time series data restoring method according to an exemplary embodiment of the present inventive concept.

FIG. 8 is a flowchart illustrating a time series data restoring method according to an exemplary embodiment of the present inventive concept. FIGS. 9 to 13 are diagrams illustrating a time series data restoring method according to an exemplary embodiment of the present inventive concept.

Referring to FIG. 8, a time series data restoring method according to an exemplary embodiment of the present inventive concept includes reading the compression result of time series data (S801).

For example, the restoring module 50 reads the compression result of the time series data stored in the storage 30, for example, as described above with reference to FIGS. 2 to 7.

Then, the method includes performing linear interpolation on the compression result (S803).

Figure 10:
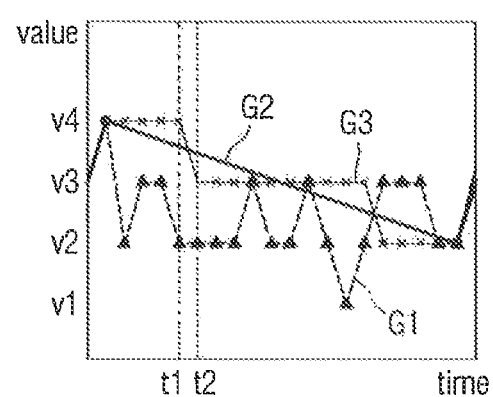

The linear interpolation may be performed to connect the abnormal points of the compression result. Referring to FIG. 10, a graph G1 is a graph showing original data, and a graph G2 is a graph obtained by performing linear interpolation on the compression result.

Referring again to FIG. 8, the time series data restoring method according to an exemplary embodiment of the present inventive concept includes adding noise to the compression result, on which the linear interpolation has been performed, using a standard deviation of the compression result (S805).

In the sensing data generated in the semiconductor process, an original value not corresponding to the noise may be useful, and the noise itself may be useful. For example, in some cases, analysis may be performed by estimating the noise level generated in the sensing data.

In this case, a virtual noise may be added to the compression result on which the linear interpolation has been performed. In the present embodiment, the standard deviation of the difference between the data restored, which is without noise, and the original data is stored, and noise addition is implemented by applying noise to the restored data.

FIG. 11 is a diagram showing an implementation of performing noise addition in pseudo code according to an exemplary embodiment of the present inventive concept.

Referring to FIG. 11, adding noise includes generating a random array in accordance with a standard deviation and a Gaussian distribution with an average of 0. The random array corresponds to a length of a restoration interval of the compression result on which the linear interpolation has been performed. For example, the restoration interval includes a left half interval and a right half interval.

Further, adding noise includes sorting the random array in descending order when a value of a left abnormal point (e.g., an index value) is smaller than α value of a right abnormal point (e.g., a next index value) in the restoration interval, and sorting the random array in ascending order when a value of a left abnormal point (e.g., an index value) is larger than α value of a right abnormal point (e.g., a next index value) in the restoration interval.

Furthermore, adding noise includes adding the left half of the sorted random array to the left half interval and adding the right half of the sorted random array to the right half interval.

The reason for the above-described noise addition is to make the noise more realistic in consideration of the characteristics of a compression algorithm, rather than simply adding a random array when adding noise. Since the compression algorithm used according to an exemplary embodiment of the present inventive concept is performed such that abnormal points are found based on the length, and values other than the abnormal points are removed. In addition, in the restoration interval, a difference between values of intermediate points tends to be not so large as compared with the left and right abnormal points.

Figure 12:
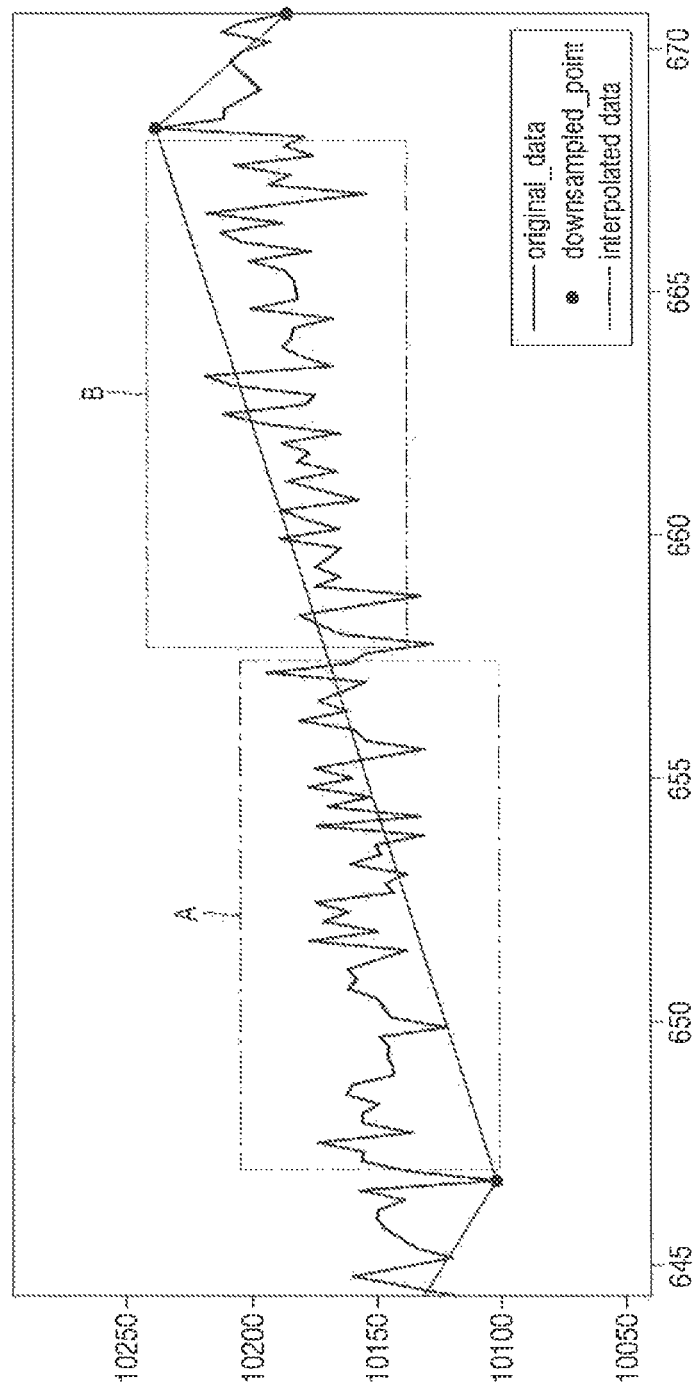

Thus, referring to FIG. 12, when continuous abnormal points continuously include a lower abnormal point and an upper abnormal point, the restored data (e.g., the compression result on which the linear interpolation has been performed) tends to appear below the original data in a left half A of the restoration interval, and the restored data tends to appear above the original data in a right half B of the restoration interval.

Figure 13:
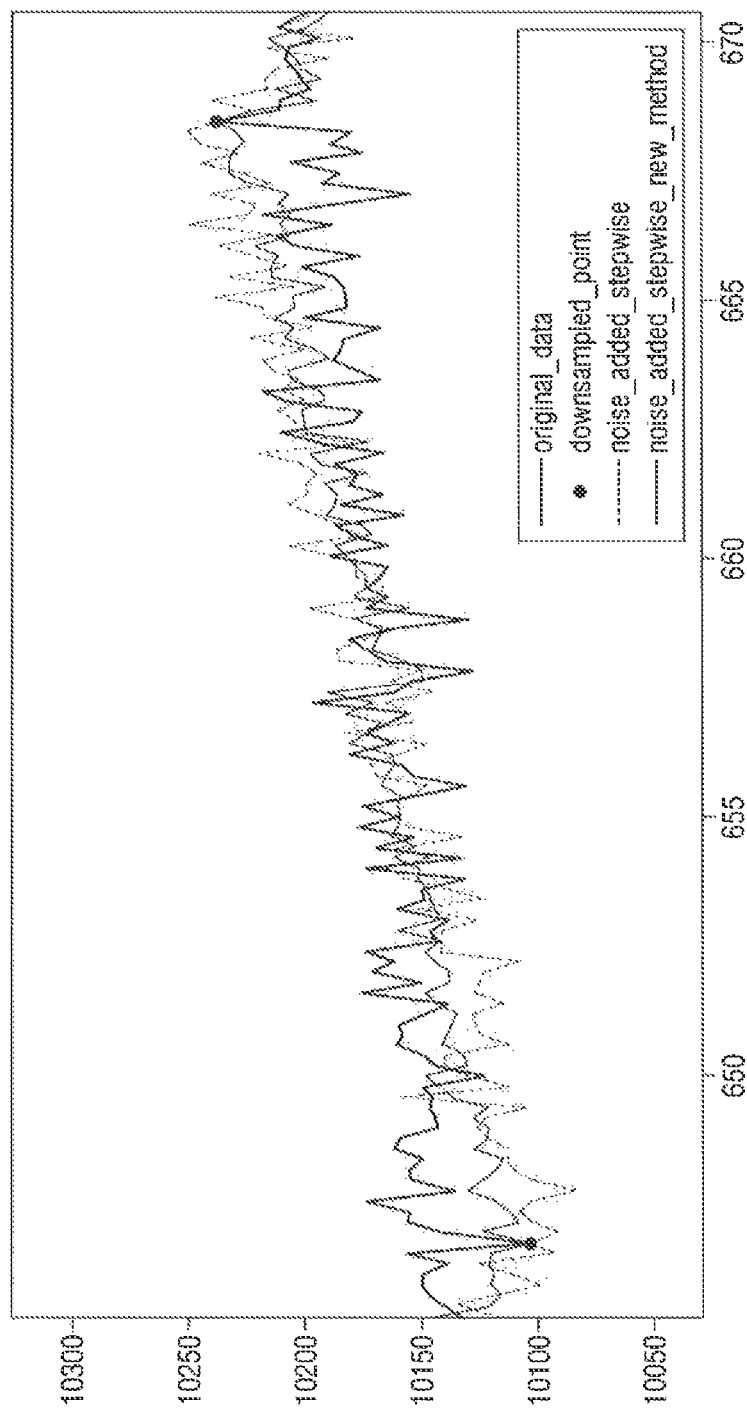

Therefore, if noise is added to reflect the above-described tendency, as shown in FIG. 13, it is possible to add noise to be more consistent with the tendency of the original data. In FIG. 13, a graph denoted by "noise_added_stepwise" shows a case of simply adding noise generated with a random array without reflecting the tendency, and a graph denoted by "noise_added_stepwise_new_method" shows a case of adding noise to be more consistent with the tendency of the original data by reflecting the above-described tendency.

If the noise is added to reflect the tendency as described above, when a value in the restoration interval is smaller than the minimum abnormal point or larger than the maximum abnormal point, the maximum value or the minimum value may be changed to prevent a phenomenon that makes the analysis of the sensing data less efficient.

Referring again to FIG. 8, the time series data restoring method according to an exemplary embodiment of the present inventive concept includes determining whether a unit for original data has been measured (S807).

If the unit for original data has been measured (Y in S807), the restoring module 50 restores the linearly interpolated compression result by using the unit (S809).

In addition, if the unit for original data has not been measured (N in S807), the restoring module 50 restores the linearly interpolated compression result by using the values of the original data (S811).

FIG. 9 is a diagram showing an implementation of steps S807, S809 and S811 in pseudo code, according to an exemplary embodiment of the present inventive concept.

Referring to FIG. 9, when the value of the unit is 0 or more, restoring the linearly interpolated compression result by using the unit includes comparing the value of the linearly interpolated compression result with the value of the left abnormal point and replacing the value of the linearly interpolated compression result with the nearest value among the points having a difference that is an integer that is a multiple of the unit from the left abnormal point.

When expressed as an equation, if the coordinate of the left abnormal point is (x0, y0) and the coordinate of the right abnormal point is (x1, y1), the value y to be replaced can be calculated as follows:

$$y=y0+\text{round}((y1-y0)/(x1-x0)*(x-x0)/\text{unit})*\text{unit}$$

where x is a time value that can be determined.

In addition, when the value of the unit is −1, restoring the linearly interpolated compression result by using the values of the original data includes comparing the value of the linearly interpolated compression result with the values of the original data and replacing the value of the linearly interpolated compression result with the nearest value among the values of the original data.

Then, the method includes outputting the restored data (S813).

The restoring module 50 may output the restored data to various output devices such as a display or a printer through the I/O interface 60. The restoring module 50 may store the restored data in the storage 30.

According to an exemplary embodiment of the present inventive concept as described above, the time series data compressing method may increase the compression ratio and the compression quality by determining a threshold using a clustering technique and performing Longest Distance downsampling with Flexible Interval (LDFI) and drop-out based on the threshold.

Further, the time series data restoring method according to an exemplary embodiment of the present invention may not only increase the accuracy of restoration by using a unit or a reference point but may also represent the tendency of the noise level in restoration data by adding noise.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:
1. A method for compressing time series data, comprising:
    reading original data including time series data;
    measuring a unit of the original data;
    determining a threshold for determining a range allowing for a difference between compressed data and the original data using a clustering technique;
    performing longest distance downsampling to preserve an abnormal point of the original data;
    storing a start point and an endpoint of the original data;
    performing drop-out on the longest distance downsampling result, wherein the drop-out is not performed for the start point and the end point; and
    if the number of values of the original data is smaller than α times the original data length, storing at least one of the values of the original data as a reference point, wherein α is a real number having a value between 0 and 1,
    wherein the method for compressing time series data is performed by a computing device.

2. The method of claim 1, wherein the performing longest distance downsampling comprises:
performing Longest Distance downsampling with Flexible Interval (LDFI), wherein the longest distance downsampling is performed by setting a window size used for setting at least one interval for performing the longest distance downsampling to a predetermined length.

3. The method of claim 1, wherein the performing longest distance downsampling comprises:
setting one or more intervals for performing the longest distance downsampling; and
sampling one data in each of the one or more intervals such that a total distance when connecting the data sampled in each, of the one or more intervals is the longest distance.

4. The method of claim 3, wherein the performing longest distance downsampling further comprises:
when a difference between a downsampling result obtained, by performing the longest distance downsampling with a first window size and the original data exceeds the threshold, dividing the first window size into a second window size corresponding to a half of the first window size; and
performing the longest distance downsampling with the second window size.

5. The method of claim 1, wherein the measuring a unit of the original data comprises:
measuring a difference between values of adjacent data m the original data as a first difference value;
measuring a difference between adjacent first difference values as a second difference value; and
determining a minimum value of the second difference value by the unit of the original data.

6. The method of claim 1, wherein the determining a threshold comprises:
measuring a difference between values of adjacent data in the original data as a first difference value;
dividing the first difference value into a first pair of clusters using K-means clustering; and
performing K-means clustering on a larger of the first pair of clusters, to divide the larger of the first pair of clusters into a second pair of clusters, wherein when a larger of the second pair of clusters is less than 85% of the larger of the first pair of clusters, determine a value corresponding to 98% of the larger of the second pair of clusters as the threshold, and
when the larger of the second pair of clusters is greater than 85% of the larger of the first pair of clusters, perform K-means clustering on the larger of the second pair of clusters to divide the larger of the second pair of clusters into a third pair of clusters.

7. The method of claim 1, wherein the performing dropoat comprises:
determining a candidate to be deleted from the longest distance downsampling result;
comparing a value of the candidate with a value of the original data; and
when a difference between the value of the candidate and the value of the original data exceeds the threshold, deleting the candidate from the longest distance downsampling result.

8. A method for restoring time series data, comprising:
reading a compression result of time series data;
performing linear interpolation on the compression result;
determining whether a unit for original data has been measured;
when it is determined that the unit for the original data has been measured, restoring the linearly interpolated compression result by using the unit; and
when it is determined that the unit for the original data has not been measured, restoring the linearly interpolated compression result by using values of the original data;
wherein the method for restoring time series data is performed by a computing device.

9. The method of claim 8, further comprising:
adding noise to the linearly interpolated compression result by using a standard deviation of the compression result.

10. The method of claim 9, wherein the adding noise comprises:
generating a random array in accordance with the standard deviation and a Gaussian distribution with an average of 0, wherein the random array corresponds to a length of a restoration interval of the linearly interpolated compression result, and the restoration interval includes a left half interval and a right half interval;
sorting the random array in descending order when a value of a left abnormal point is mailer than a value of a right abnormal point in the restoration interval;
sorting the random array in ascending order when the value of the left abnormal point is larger than the value of the right abnormal point in the restoration interval; and
adding a left half of the sorted random array to the left half interval and adding a right half of the sorted random array to the right half interval.

11. The method of claim 8, wherein the restoring the linearly interpolate compression result by using the unit comprises:
comparing a value of the linearly interpolated compression result with a value of a left abnormal point and replacing the value of the linearly interpolated compression result with the nearest value among points having a difference that is equal to an integer that is a multiple of a unit from the left abnormal point.

12. The method of claim 8, wherein the restoring the linearly interpolated compression result by using values of the original data comprises:
comparing a value of the linearly interpolated compression result with the values of the original data and replacing the value of the linearly interpolated compression result with the nearest value among the values of the original data.

13. A computing device comprising:
a time series data compressing module configured to: read original data including time series data,
measure a unit of the original data,
determine a threshold for determining a range allowing for a difference between compressed data and the original data,
perform longest distance downsampling to preserve an abnormal point of the original data,
store a start point and an end point of the original data,
perform drop-out on the longest distance downsampling result, wherein the drop-out is not performed for the start point and the end point, and
when the number of values of the original data is smaller than $\alpha$ times the original data length, store at least one of the values of the original data as a reference point, wherein $\alpha$ is a real number having a value between 0 and 1; and
a time series data restoring module configured to: read a compression result of the time series data, perform linear interpolation on the compression result, determine whether the unit for original data has been measured, when it is determined that the unit for the original data has been measured, restore the linearly interpolated compression result by using the unit, and when it is determined that the unit for the original data has not been measured, restore the linearly interpolated compression result by using values of the original data.

14. The computing device of claim 13, wherein the performing longest distance downsampling comprises:

performing Longest Distance downsampling with Flexible Interval (LDFI), wherein the longest distance downsampling is performed by setting a window size used for setting at least one interval for performing the longest distance downsampling to a predetermined length.

15. The computing device, of claim 13, wherein the time series data restoring module adds noise to the linearly interpolated compression result by using a standard deviation of the compression result.

* * * * *